(12) United States Patent
Niu et al.

(10) Patent No.: US 12,163,212 B2
(45) Date of Patent: Dec. 10, 2024

(54) MASK SHEET INCLUDING RIB AND MASK DEVICE

(71) Applicants: Chengdu BOE Optoelectronics Technology Co., Ltd., Chengdu (CN); BOE Technology Group Co., Ltd., Beijing (CN)

(72) Inventors: Tong Niu, Beijing (CN); Fengli Ji, Beijing (CN); Chang Luo, Beijing (CN); Qian Xu, Beijing (CN); Guomeng Zhang, Beijing (CN); Yan Huang, Beijing (CN); Jianbo Li, Beijing (CN)

(73) Assignees: Beijing BOE Technology Development Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 468 days.

(21) Appl. No.: 17/436,756

(22) PCT Filed: Dec. 25, 2020

(86) PCT No.: PCT/CN2020/139360
§ 371 (c)(1),
(2) Date: Sep. 7, 2021

(87) PCT Pub. No.: WO2022/133994
PCT Pub. Date: Jun. 30, 2022

(65) Prior Publication Data
US 2022/0205076 A1    Jun. 30, 2022

(51) Int. Cl.
C23C 14/04      (2006.01)
C23C 14/24      (2006.01)
H10K 71/16     (2023.01)

(52) U.S. Cl.
CPC ............ *C23C 14/042* (2013.01); *C23C 14/24* (2013.01); *H10K 71/166* (2023.02)

(58) Field of Classification Search
CPC .............................. C23C 14/042; C23C 14/24
See application file for complete search history.

(56) References Cited

U.S. PATENT DOCUMENTS 10,982,314 B2 *   4/2021  Lin .................... H10K 71/00
11,501,992 B2 *  11/2022  Ikenaga ............. H10K 71/00
(Continued)

FOREIGN PATENT DOCUMENTS

CN      206266701 U      6/2017
CN      111088474 A      5/2020
(Continued)

*Primary Examiner* — Karl Kurple
(74) *Attorney, Agent, or Firm* — Westman, Champlin & Koehler, P.A.

(57) ABSTRACT

A mask sheet for evaporation on a substrate is provided, and the mask sheet includes: a plurality of first ribs extending in a first direction; and a plurality of second ribs extending in a second direction intersecting the first direction, the mask sheet includes a first region for an evaporation of a first exposure region of the substrate and a second region for an evaporation of a second exposure region of the substrate, a third rib is provided at a boundary of the first region and the second region so as to shield an overlapping exposure region between the first exposure region and the second exposure region, the third rib includes a first sub-rib, a second sub-rib, and a spacer for separating the first sub-rib and the second sub-rib, and the third rib has a width greater than that of the first rib.

16 Claims, 8 Drawing Sheets

(56) References Cited

U.S. PATENT DOCUMENTS

| | | | | |
|---|---|---|---|---|
| 2007/0072337 | A1* | 3/2007 | Matsuzaki | H10K 71/166 |
| | | | | 438/99 |
| 2010/0055810 | A1* | 3/2010 | Sung | H10K 50/11 |
| | | | | 438/22 |
| 2012/0156812 | A1* | 6/2012 | Ko | C23C 14/042 |
| | | | | 29/446 |
| 2014/0150721 | A1* | 6/2014 | Oh | C23C 14/042 |
| | | | | 118/504 |
| 2016/0312354 | A1* | 10/2016 | Ko | H10K 71/60 |
| 2018/0209029 | A1* | 7/2018 | Lin | B05C 21/005 |
| 2018/0312957 | A1* | 11/2018 | Zhang | C23C 14/12 |
| 2020/0002801 | A1* | 1/2020 | Nakajima | H10K 71/166 |
| 2020/0384497 | A1* | 12/2020 | Lv | C23C 14/042 |

FOREIGN PATENT DOCUMENTS

| | | | | |
|---|---|---|---|---|
| CN | 111733380 A | | 10/2020 | |
| CN | 111850467 A | * | 10/2020 | C23C 14/24 |

* cited by examiner

MASK SHEET INCLUDING RIB AND MASK DEVICE

CROSS REFERENCE TO RELATED APPLICATION(S)

The present disclosure is a Section 371 National Stage Application of International Application No. PCT/CN2020/139360, filed on Dec. 25, 2020, entitled "MASK SHEET AND MASK DEVICE", the content of which is hereby incorporated by reference in its entirety.

TECHNICAL FIELD

The present disclosure relates to a field of a display technology and a field of a mask technology, and in particular to a mask sheet and a mask device.

BACKGROUND

With a progress of a display technology, Organic Light-Emitting Diode (OLED) display devices are one of hot spots in a research field of flat panel display devices. In a process of manufacturing the OLED display device, a mask is generally used for evaporation so as to form various patterned film layers, for example, to form an organic light-emitting layer.

A narrow border and a special-shaped display are urgent needs in the era of flexible display, followed by a plurality of problems of the mask in accuracy, special-shaped shielding, and stretched net. A mask assembly for evaporation is generally assembled by a mask frame, a mask sheet, a mask (such as a fine metal mask (FMM)) and so on. In a process of manufacturing the mask sheet, the mask sheet is firstly stretched under an action of an external force so as to reduce an amount of sagging, and then fixed to the mask frame, for example, by welding. By using the FMM, a light-emitting material may be deposited on a corresponding portion of a glass substrate by evaporation. An area that does not need to be illuminated may be shielded by the mask sheet.

SUMMARY

Embodiments of the present disclosure provide a mask sheet for evaporation on a substrate, including:
  a plurality of first ribs extending in a first direction; and
  a plurality of second ribs extending in a second direction intersecting the first direction, wherein the plurality of first ribs and the plurality of second ribs cross each other to form a plurality of opening regions, the mask sheet includes a first region for an evaporation of a first exposure region of the substrate and a second region for an evaporation of a second exposure region of the substrate, a third rib is provided at a boundary of the first region and the second region so as to shield an overlapping exposure region between the first exposure region of the substrate and the second exposure region of the substrate, the third rib includes a first sub-rib, a second sub-rib, and a spacer for separating the first sub-rib and the second sub-rib, and the third rib has a width greater than that of the first rib.

In some embodiments, the boundary of the first region and the second region extends in the first direction, and the first sub-rib and the second sub-rib extend parallel to the first rib.

In some embodiments, the spacer extends parallel to the first sub-rib and the second sub-rib in the first direction.

In some embodiments, the spacer includes at least one through hole extending along a side of an opening region; wherein said side of the opening region is adjacent to the third rib, a length of the through hole in the first direction is less than or equal to a length of the side of the opening region adjacent to the third rib.

In some embodiments, the mask sheet further includes a shielding member configured to shield the through hole, wherein the shielding member is located on a side of the third rib away from the substrate, and an orthographic projection of the shielding member on the third rib in a direction perpendicular to the mask sheet covers the through hole of the third rib.

In some embodiments, the shielding member is made of a non-magnetic material.

In some embodiments, the spacer includes at least one groove extending along a side of an opening region; wherein said side of the opening region is adjacent to the third rib, and a length of the groove in the first direction is less than or equal to a length of the side of the opening region adjacent to the third rib.

In some embodiments, a depth of the groove is 0.5 to 0.8 times a depth of the first sub-rib.

In some embodiments, a width of the first sub-rib is 1 to 1.2 times a width of the first rib parallel to the first sub-rib and the second sub-rib; and/or a width of the second sub-rib is 1 to 1.2 times the width of the first rib parallel to the first sub-rib and the second sub-rib.

In some embodiments, the first rib and the second rib are perpendicular to each other and are integrally formed.

In some embodiments, the mask sheet further includes a fourth rib located at an edge portion of the mask sheet and arranged parallel to the first rib or the second rib.

In some embodiments, a width of the fourth rib is 1 to 1.2 times a width of the first rib or the second rib parallel to the fourth rib.

The embodiments of the present disclosure further provide a mask device, including:
  the mask sheet according to any of the embodiments described above; and
  at least one mask arranged on a side of the mask sheet facing a substrate, wherein the at least one mask is configured to cover a plurality of opening regions of the mask sheet.

In some embodiments, the mask device further includes:
  a mask frame configured to support and fix the mask sheet and the mask; and
  a magnetic plate located on a side of the substrate away from the mask sheet, wherein the mask sheet and the mask include a magnetic material, and the magnetic plate is configured to attract the mask and the mask sheet toward the substrate through a magnetic force.

In some embodiments, the mask device further includes an alignment mask connected to the mask frame and arranged side by side with the mask so as to provide an alignment reference for the mask, wherein the mask sheet further includes a fourth rib located at an edge portion of the mask sheet and arranged parallel to the first rib or the second rib, and an orthographic projection of the fourth rib in a direction perpendicular to the mask sheet overlaps an orthographic projection of the alignment mask in the direction perpendicular to the mask sheet.

BRIEF DESCRIPTION OF THE DRAWINGS

By reading the detailed description of the non-limiting embodiments with reference to the accompanying drawings, other features, objectives and advantages of the present disclosure will become more apparent.

DETAILED DESCRIPTION OF EMBODIMENTS

Figure 1:
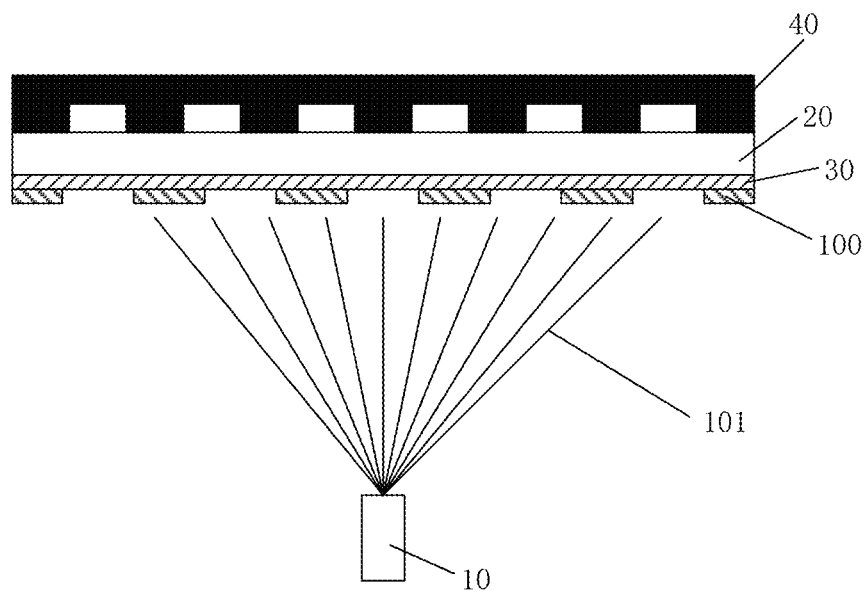
FIG. 1 shows a schematic diagram of evaporating a light-emitting material on a substrate by using a mask assembly.

The present disclosure will be further described in detail below with reference to the accompanying drawings and embodiments. It may be understood that the specific embodiments described here are only used to explain the related invention, but not to limit the present disclosure. In addition, it should be noted that, for ease of description, only the portions related to the present disclosure are shown in the accompanying drawings.

It should be noted that, in a case of no conflict, the embodiments in the present disclosure and the features in the embodiments may be combined with each other.

In addition, in the following detailed description, for the convenience of explanation, many specific details are set forth to provide a comprehensive understanding of the embodiments of the present disclosure. Obviously, however, one or more embodiments may also be implemented without these specific details.

It should be understood that, although terms "first," "second" and so on may be used herein to describe different elements, these elements should not be limited by these terms. These terms are only used to distinguish one element from another element. For example, without departing from the scope of the exemplary embodiments, a first element may be named as a second element, and similarly, the second element may be named as the first element. A term "and/or" as used here includes any and all combinations of one or more related listed items.

It should be understood that when an element or layer is referred to as being "formed on" another element or layer, the element or layer may be directly or indirectly formed on the another element or layer. That is, for example, an intermediate element or an intermediate layer may be present. In contrast, when an element or layer is referred to as being "directly formed on" another element or layer, no intermediate elements or layers are present. Other terms used to describe a relationship between elements or layers (for example, "between" and "directly between", "adjacent to" and "directly adjacent to", etc.) should be interpreted in a similar manner.

The terms used herein are only for the purpose of describing specific embodiments, and are not intended to limit the embodiments. As used herein, unless otherwise specified in the context, a singular form is also intended to include a plural form. It should also be understood that when terms "comprising" and/or "including" are used herein, it means that the described features, wholes, steps, operations, elements and/or components are present, but do not exclude the presence or addition of one or more other features, wholes, steps, operations, elements, components and/or combinations thereof.

In the present disclosure, unless otherwise specified, expressions "located in the same layer" and "arranged in the same layer" generally mean that a first component and a second component may be formed of the same material and may be formed by the same patterning process. The expressions "located in different layers" and "arranged in different layers" generally indicate that the first component and the second component are formed by different patterning processes.

An organic light-emitting layer in an organic light-emitting diode (OLED) display panel is a necessary structure for achieving a light emission in a film structure. When the display panel is operating, the organic light-emitting layer may be excited to emit light by controlling a voltage applied to an anode electrode and a cathode electrode. The organic light-emitting layer may be formed, for example, by evaporation. In a process of forming the organic light-emitting layer by evaporation, a mask (or referred to as a fine metal mask (FMM)) assembly is needed.

Figure 3:
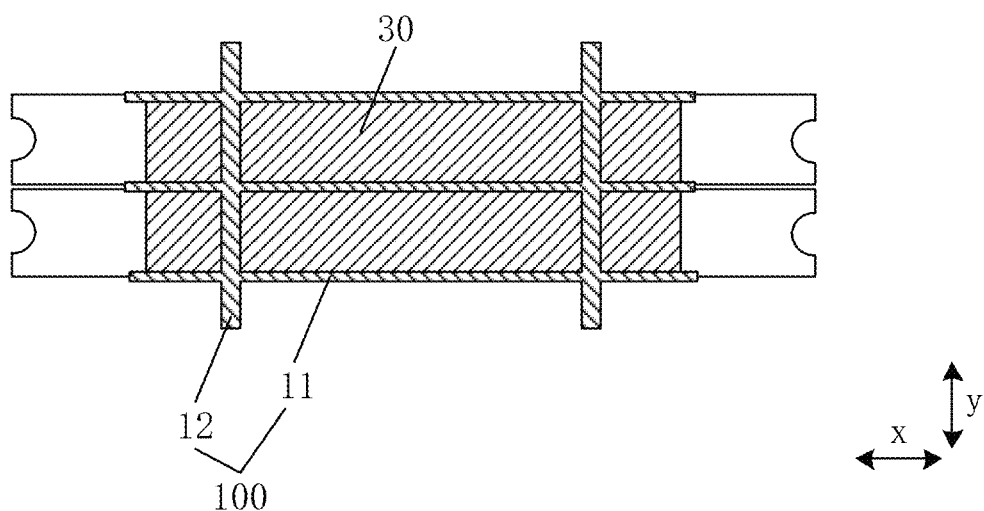
FIG. 3 schematically shows a mutual positional relationship between a mask sheet and the FMM in a plan view.

Evaporation is currently one of main processes of forming film layers such as a light-emitting material on a display panel. FIG. 1 shows a schematic diagram of a principle of an evaporation using a mask assembly. An evaporation source 10 is shown in FIG. 1, and the evaporation source 10 evaporates a material 101 to a substrate 20 (for example, a glass substrate) located above the evaporation source 10. A mask 30 (for example, a fine metal mask (FMM)) is attached to a lower surface of the substrate 20. The mask 30 may have some patterns. The material (for example, a light-emitting material) from the evaporation source 10 may pass through the mask 30 and may be deposited on the substrate 20 so as to form a pattern in a display region of a display panel. The mask sheet 100 is used to support and fix the mask 30 on the lower surface of the substrate 20. Specifically, the mask sheet 100 may be made of a metal material. The mask sheet 100 located under the substrate 20 may be attracted by a magnetic plate 40 provided above the substrate 20, so as to fix and hold the mask 30 on the lower surface of the substrate 20. In addition, the mask sheet 100 may shield a non-light-emitting region of the substrate where a deposition of the evaporation material is not desired. By way of example, the mask sheet 100 may be made as a whole. A relative positional relationship between the mask sheet 100 and the mask 30 is shown in FIG. 3. As clearly shown in FIG. 3, the mask sheet 100 mainly includes a plurality of first ribs 11 extending in a first direction (for example, x-direction) and a plurality of second ribs 12 extending in a second direction (for example, y-direction).

Figure 2:
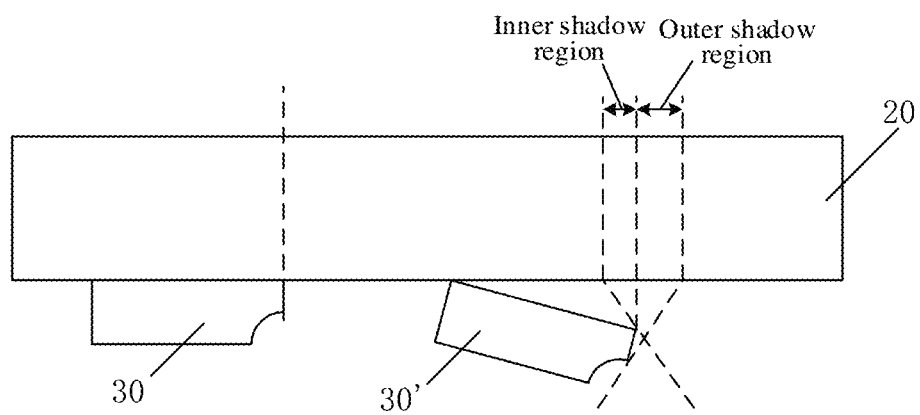
FIG. 2 schematically shows an influence of FMM warping from the substrate on a shadow region.

Ideally, the mask 30 may be in close contact with the lower surface of the substrate 20, and in practice, due to various reasons, a part of the mask 30 may be warped, so that an obvious gap is formed between the mask 30 and the lower surface of the substrate 20. Such a gap may cause the mask 30 to produce a shadow on the substrate 20. As shown in FIG. 2, if the mask 30 is in close contact with the lower surface of the substrate 20 (see the left in FIG. 2), a pattern formed on the substrate 20 by the material through the mask 30 has a clear boundary, as shown by a vertical dashed line on the left. If a mask 30' is deflected, a gap is formed between the mask 30' and the lower surface of the substrate 20. Due to an existence of the gap between the mask 30' and the lower surface of the substrate 20, a pattern formed on the substrate 20 by the material through the mask 30' does not have a clear boundary, and includes an inner shadow region and an outer shadow region (see the right in FIG. 2). Furthermore, with an increase of the gap, a range of the shadow region may also increases, which may cause defects.

Figure 4:
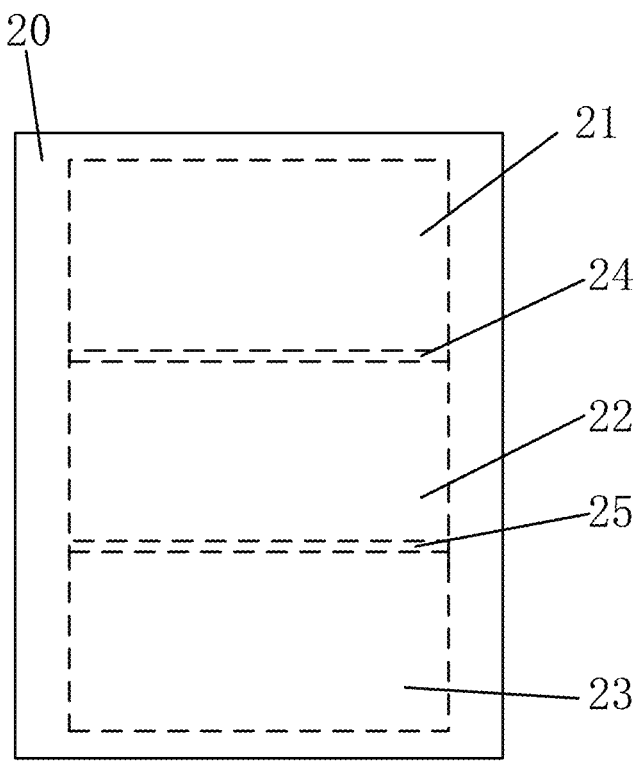
FIG. 4 shows a schematic diagram of a plurality of exposure regions of a film structure.

For a display panel, a film structure (e.g., a thin film transistor) on the substrate 20 needs to be manufactured through an exposure-etching process. Due to limitations of process and apparatus, the film structure on the substrate 20 may be achieved by a plurality of sub-regional exposures. That is, only a part of the substrate 20 is exposed each time, and an exposure of the entire substrate 20 is achieved by a plurality of times of exposures. The substrate 20 may be divided into different exposure regions for different times of exposure. For example, a region of the substrate 20 exposed at a first time may be called a first exposure region 21, a region of the substrate 20 exposed at a second time may be called a second exposure region 22, and a region of the substrate 20 exposed at a third time, if any, may be called a third exposure region 23, as shown in FIG. 4.

Figure 5:
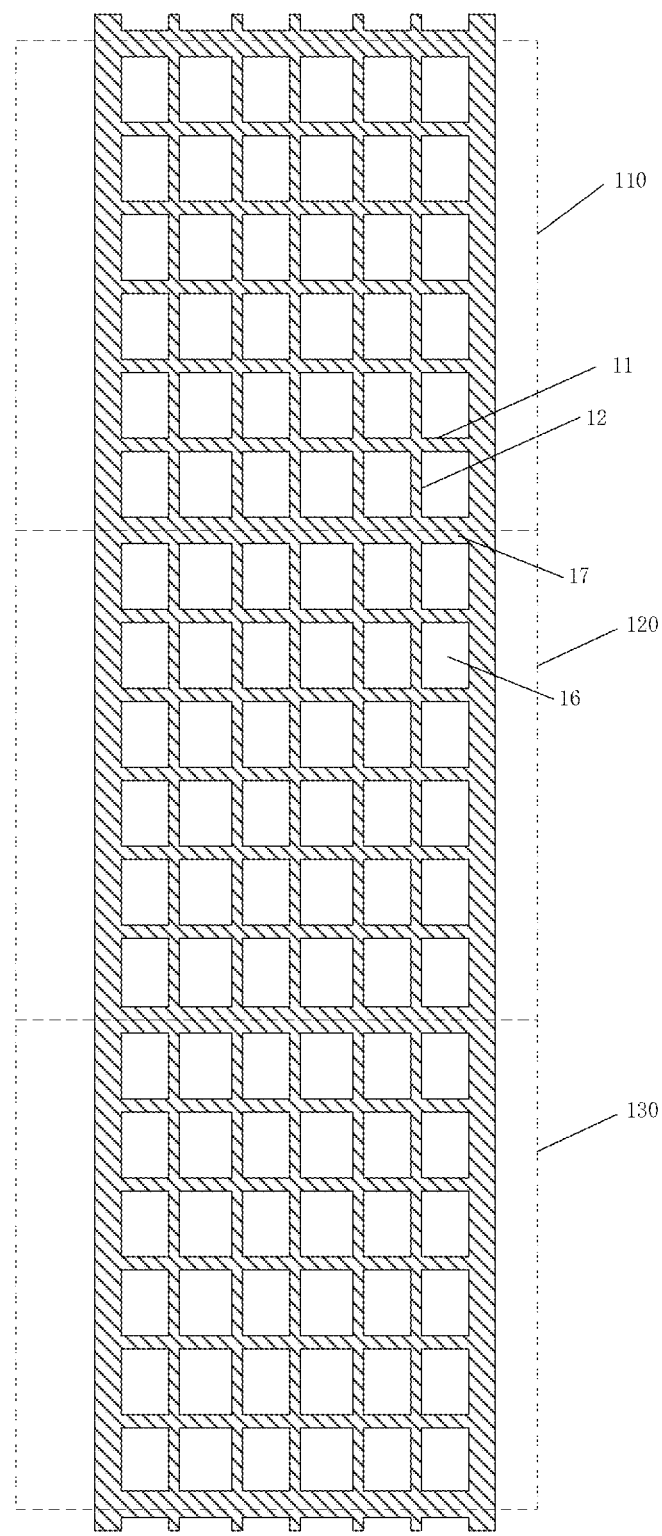
FIG. 5 shows an example of a mask sheet adapted to a plurality of exposure regions.

The inventors have found that in a practical evaporation process, evaporation defects are prone to exist at a junction of adjacent exposure regions of the substrate 20. A transition region may be provided between adjacent exposure regions of the substrate 20 (for example, at a junction of the first exposure region 21 and the second exposure region 22, and at a junction of the second exposure region 22 and the third exposure region 23 in FIG. 4). The transition region may be exposed in two times of exposures, and may be called an overlapping exposure region. For example, in the example of FIG. 4, a first overlapping exposure region 24 located between the first exposure region 21 and the second exposure region 22 and a second overlapping exposure region 25 located between the second exposure region 22 and the third exposure region 23 are shown. An existence of the overlapping exposure region may prevent an edge of an effective film pattern from being overexposed, but also result in an existence of an additional edge region at a boundary between adjacent exposure regions. Accordingly, a rib of the mask sheet 100 in a position corresponding to the region may have a greater width, so as to better cover such the edge region. An example of the mask sheet 100 is shown in FIG. 5. In this example, a rib of the mask sheet 100 arranged in the position corresponding to the boundary between adjacent exposure regions has a width greater than that of a rib of the mask sheet 100 arranged in a position corresponding to a normal region of the exposure region.

Figure 6A:
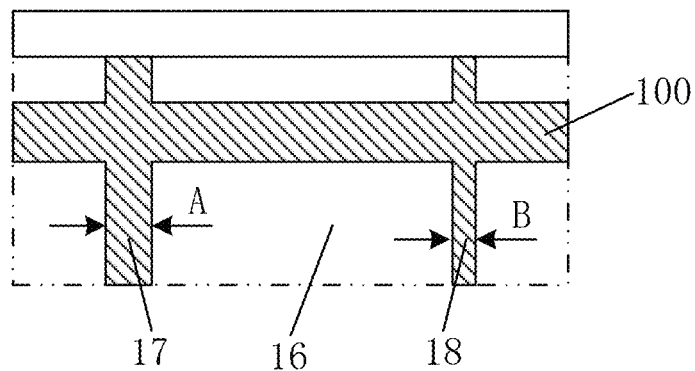
FIG. 6A schematically shows a comparison between a rib of the mask sheet corresponding to an overlapping region of exposure regions and a rib in a normal region.
Figure 7:
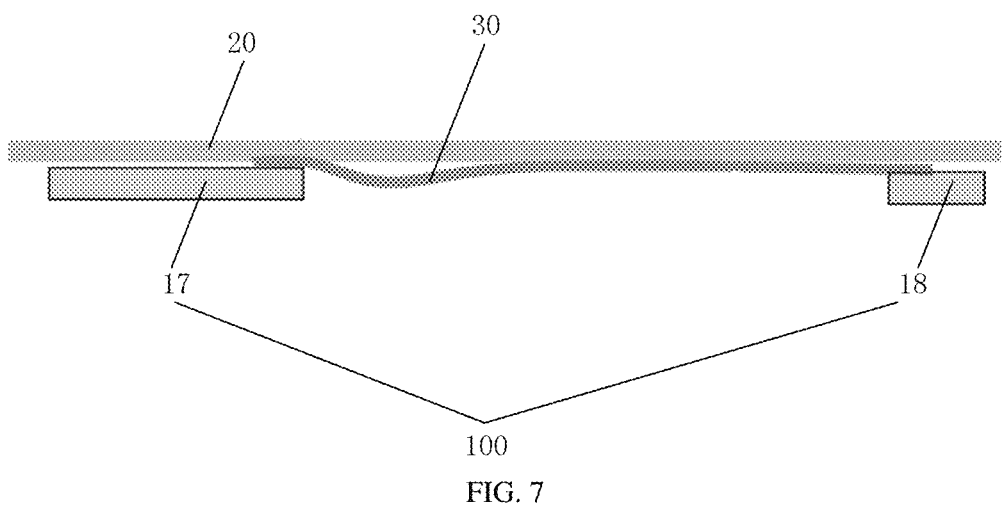
FIG. 7 shows an exemplary bonding state of the FMM and the substrate.

A difference in the width of the ribs of the mask sheet 100 is shown more clearly in FIG. 6A. The width of the rib of the mask sheet 100 arranged in the position corresponding to the boundary between adjacent exposure regions is indicated by A, and the width of the rib of the mask sheet 100 arranged in the position corresponding to the normal region of the exposure region is indicated by B. The inventors have found that potential defects of evaporation are caused by the difference in the width of the ribs. This will be described below with reference to FIG. 7.

For the convenience of description, here, the wider rib of the mask sheet 100 described above is referred to as a wide rib 17, and the narrower rib of the mask sheet 100 described above is referred to as a narrow rib 18. Due to the difference in the width of the ribs, a large gap between the mask 30 and the substrate 20 may be formed close to the wide rib 17 when the mask 30 is held on the lower surface of the substrate 20 by the mask sheet 100, which causes evaporation defects. The following derivation is based on a solution that the magnetic plate 40 attracts the mask sheet 100 by a magnetic force from the side of the substrate 20 away from the mask sheet 100 so as to fix and hold the mask 30.

In a uniform magnetic field, an expression of calculating the magnetic force of the magnetic plate 40 received by a region of the mask 30 may be simplified as Expression (1).

$$F = \frac{1}{2\mu} B_0^2 S \qquad \text{Expression (1)}$$

where $\mu$ indicates a vacuum permeability (constant), $B_0$ indicates a magnetic induction intensity in the region, and S indicates a contact area between the magnetic field and a magnetic conductor. Assuming that a region 1 of the mask 30 (where the wide rib is located) has an area of $S_1$, a region 2 of the mask 30 (where the narrow rib is located) has an area of $S_2$, and the area $S_1$ of the region 1 and the area $S_2$ of the region 2 satisfy a relational expression $S_1=kS_2$ (k is a coefficient greater than 1), then it may be concluded that a gravity $G_1$ received by the region 1 and a gravity $G_2$ received by the region 2 satisfy a relational expression $G_1=kG_2$. Furthermore, the region 1 is generally farther from a center than the region 2, and thus, the region 2 has a sagging greater than that of the region 1, that is, the region 1 is closer to the lower surface of the substrate 20 than the region 2. Moreover, the magnetic induction intensity $B_{01}$ in the region 1 and the magnetic induction intensity $B_{02}$ in the region 2 satisfy a relational expression $B_{01}>B_{02}$, so it may be deduced that a magnetic force $F_1$ received by the region 1 and a magnetic force $F_2$ received by the region 2 satisfy a relational expression $F_1>kF_2$. Each of the region 1 and the region 2 of the mask 30 may receive a combined force of the magnetic force and the gravity, that is:

$$F_1 - G_1 > F_2 - G_2 \qquad \text{Expression (2)}$$

After entering an evaporation chamber, the mask 30 is attracted by the magnetic force and attached to the substrate. It may be obtained that an acceleration $a_1$ of the region 1 after being attracted and an acceleration $a_2$ of the region 2 after being attracted may satisfy a relational expression (3).

$$a_1 > a_2 \qquad \text{Expression (3)}$$

From a relational expression of an acceleration a and a displacement D, $D = v_0 t + \frac{1}{2} a t^2$ (where $v_0$ indicates an initial velocity, and t indicates time), $D_1<D_2$, it may be obtained that a displacement time $t_1$ of the region 1 after being attracted and a displacement time $t_2$ of the region 2 after being attracted satisfy a relational expression (4).

$$t_1 < t_2 \qquad \text{Expression (4)}$$

It may be derived that the wide rib 17 of the mask sheet 100 may be firstly attached to the substrate 20 under the action of the magnetic force, and the narrow rib 18 may attached to the substrate 20 later. After being attached, the wide rib 14 may press the mask 30 on the lower surface of the substrate 20 and hinder a movement of the mask 30 after being attracted by the magnetic force, which is not conducive to stretching of the mask 30, so that a gap is formed between the mask 30 and the lower surface of the substrate 20, and defects of shadow region may be further caused close to the wide rib 17 after the evaporation.

The embodiments of the present disclosure provide a mask sheet 100' for the evaporation on the substrate 20. The mask sheet 100' may include a plurality of first ribs 11 extending in the first direction and a plurality of second ribs 12 extending in the second direction intersecting the first direction (for example, the first direction is the x-direction, and the second direction is the y-direction). The plurality of first ribs 11 and the plurality of second ribs 12 cross each other to form a plurality of opening regions 16. The mask sheet 100' may include a first region 110 and a second region 120. The first region 110 is used for an evaporation of the first exposure region 21 of the substrate 20, and the second region 120 is used for an evaporation of the second exposure region 22. A third rib 13 is provided at a boundary between the first region 110 and the second region 120. The third rib 13 is used to shield an overlapping exposure region 24 between the first exposure region 21 of the substrate 20 and the second exposure region 22 of the substrate 20. The third rib 13 may include a first sub-rib 131, a second sub-rib, and a spacer 133 for separating the first sub-rib 131 and the second sub-rib 132. The third rib 13 has a width greater than that of the first rib.

In some embodiments, a boundary between the first region 110 and the second region 120 of the mask sheet 100' extend in the first direction (e.g., the x-direction). In this case, the third rib 13 and the first rib 11 both extend in the first direction and are arranged parallel to each other. Similarly, the first sub-rib 131, the second sub-rib 132 and the spacer 133 also extend in parallel in the first direction.

Figure 8:
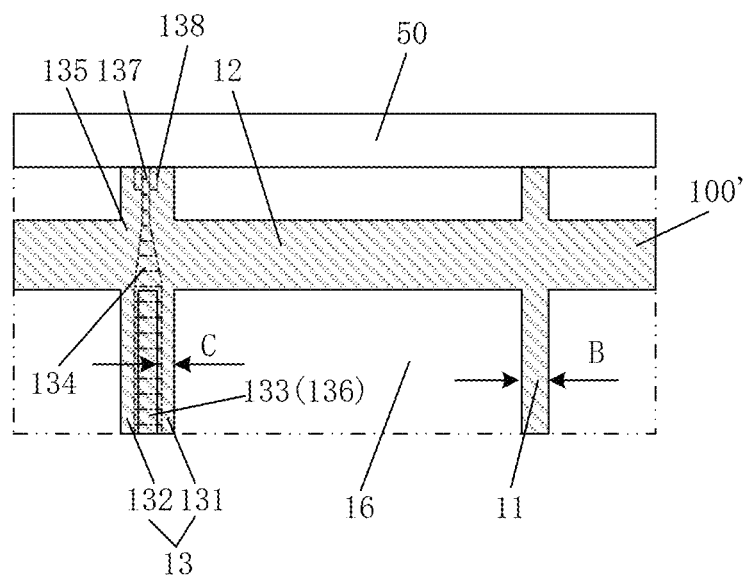
FIG. 8 shows a schematic diagram of a third rib of a mask sheet according to some embodiments of the present disclosure.
Figure 10:
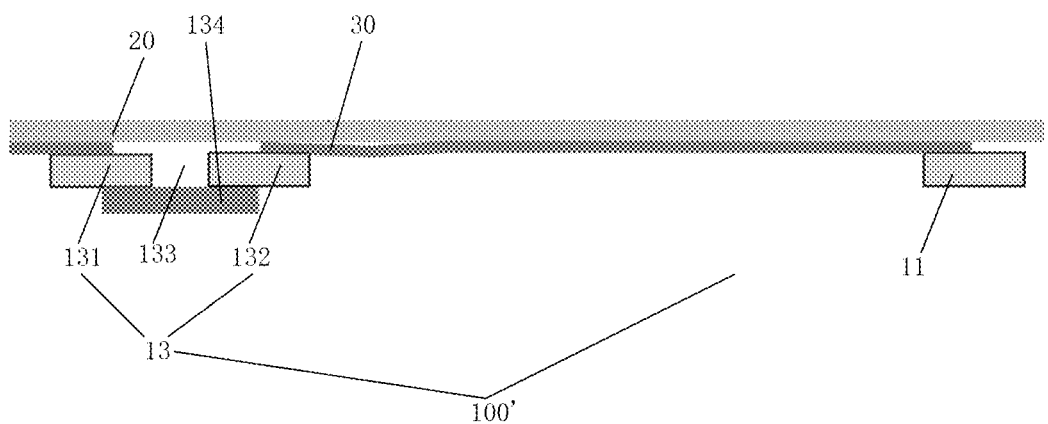
FIG. 10 shows a schematic diagram of the mask sheet shown in FIG. 8 clamping a mask on the substrate.

As shown in FIG. 8, in this embodiment, the third rib 13 in the form of a combination of sub-ribs, instead of the wide rib 17 described in the above-mentioned example, is adopted at the boundary between the first region 110 of the mask sheet 100' corresponding to the first exposure region 21 of the substrate 20 and the second region 120 of the mask sheet 100' corresponding to the second exposure region 22 of the substrate 20. As shown in FIG. 8, due to an existence of the spacer 133, a width of a solid part of the third rib 13 (as shown by C in FIG. 8) is obviously less than the width of the wide rib 17 in the above-mentioned example. FIG. 10 shows a schematic diagram of a principle of fixing the mask 30 on the substrate 20 by the mask sheet 100' including the third rib 13 described above. In this case, the first sub-rib 131 and the second sub-rib 132 are separately attracted by the magnetic plate 40, and the time required for a movement of the first sub-rib 131 and the second sub-rib 132 is longer than that for the movement of the wide rib 17, so that the mask 30 has sufficient time to stretch after being attracted by the magnetic plate 40. In this way, the warping of the mask 30 and the gap between the mask 30 and the substrate 20 may be reduced. This helps to suppress the shadow region effect described above and the evaporation defects described above.

In some embodiments, a width of the first sub-rib 131 is 1 to 1.2 times the width of the first rib 11 parallel to the first sub-rib 131 and the second sub-rib 132. Similarly, a width of the second sub-rib 132 may also be 1 to 1.2 times the width of the first rib 11 parallel to the first sub-rib 131 and the second sub-rib 132, so that the width of the first sub-rib 131 and the width of the second sub-rib 132 as close as possible to the width of the first rib 11 or the second rib 12 in the normal region of the mask sheet 100'. It should be noted that the first rib 11 and the second rib 12 may have different widths. However, the embodiments of the present disclosure are not limited to this, and the width of the first sub-rib 131 and the width of the second sub-rib 132 may also be in other numerical ranges.

Figure 14:
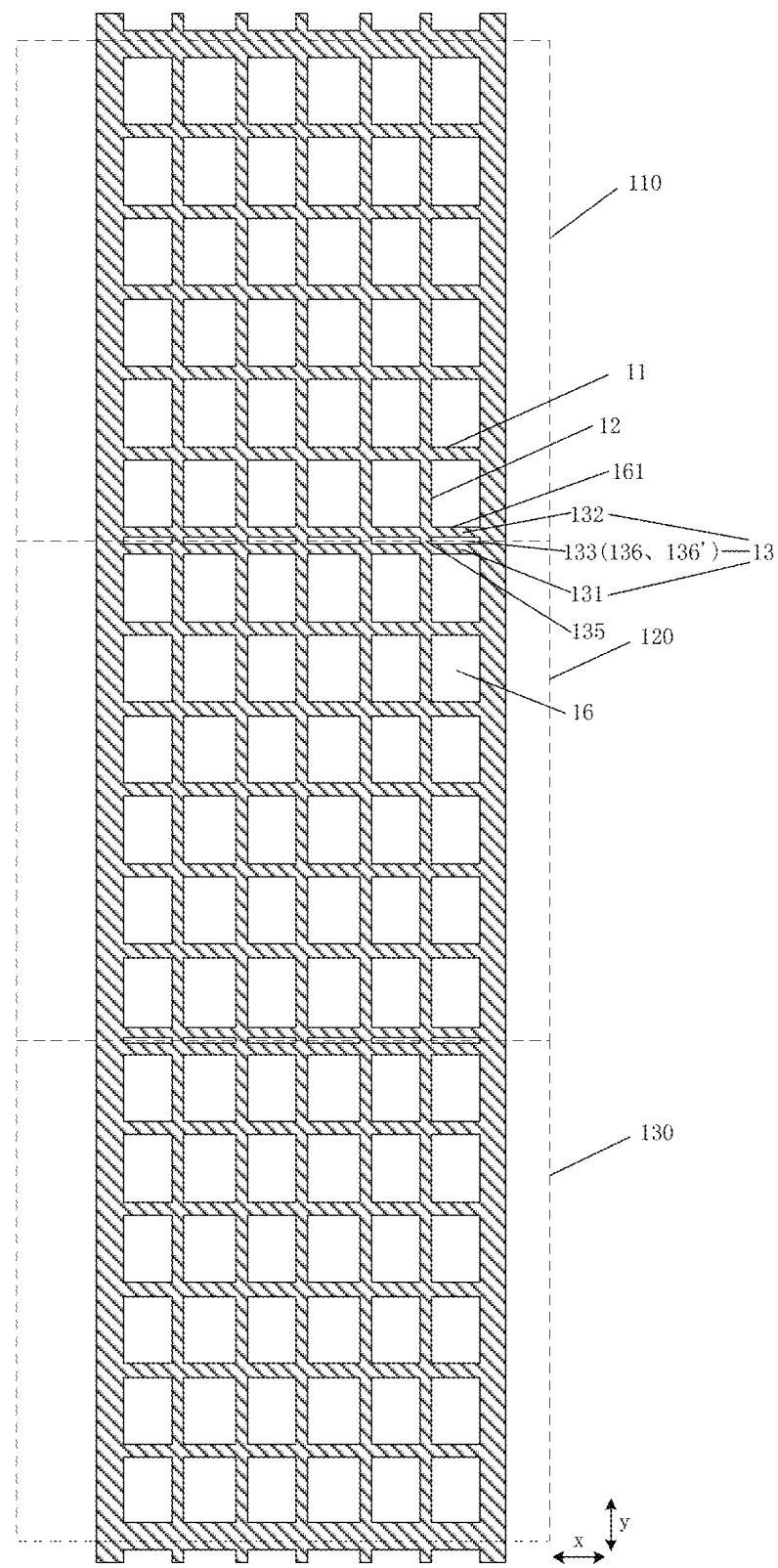
FIG. 14 shows a schematic plan view of a mask sheet according to some embodiments of the present disclosure.

In the examples shown in FIG. 8 and FIG. 10, the spacer 133 may include at least one through hole 136, and the through hole may be, for example, a rectangular hole, a circular hole, or a hole of other shapes. FIG. 14 shows a schematic plan view of the mask sheet 100'. As shown in FIG. 14, the through hole 136 may extend along a side 161 of the opening region 16 and a length of the through hole 136 in the first direction is less than or equal to a length of the side 161 of the opening region 16 adjacent to the third rib 13. By way of example, the length of the through hole 136 in the first direction is less than or equal to the length of the side 161, adjacent to the third rib 13, of the opening region 16 adjacent to the third rib 13. As shown in FIG. 8 and FIG. 14, the third rib 13 together with adjacent first rib 11 and second rib 12 may enclose the opening region 16. An opening length of the through hole 136 of the third rib 13 may be equal to or less than a length of the side of the opening region 16 defined by the third rib 13. In order to avoid obviously weakening a strength of the mask sheet 100', by way of example, the through hole 136 is not provided at an intersection 135 of the third rib 13 and other ribs (for example, the first rib 11 or the second rib 12). In other words, a length of the first sub-rib 131 and a length of the second sub-rib 132 of the third rib 13 may be equal to or less than the side length of the opening region 16 defined by the third rib 13. In a case that the through hole 136 is provided in the spacer 133 of the third rib 13, in order to prevent the evaporation material from passing through the spacer 133 and reaching the substrate 20, a shielding member 134 (or called a shielding mask) may be provided to shield the spacer 133. The shielding member 134 is located on a side of the third rib 13 away from the mask 30 (or called a side of the third rib 13 away from the substrate 20), and an orthographic projection of the shielding member 134 on the third rib 13 in a direction perpendicular to the mask sheet 100' covers the through hole 136 of the third rib 13. In the embodiments of the present disclosure, various ribs may have a long strip shape. The spacer 133 (or the through hole 136) may also have a long strip shape. By way of example, the shielding member 134 may also include a long strip shape corresponding to the through hole 136 of the third rib 13. A width and a length of the shielding member 134, for example, may respectively exceed the width and the length of the through hole 136 of the third rib 13, so as to achieve a complete coverage of the through hole. In addition, the width of the shielding member 134 may not exceed a total width of the third rib 13, that is, the shielding member 134 does not exceed an outer edge of the first sub-rib 131 and an outer edge of the second sub-rib 132.

In some embodiments, the shielding member 134 may be pressed and fixed on a surface of the third rib 13 facing away from the substrate 20. In order to fix and hold the shielding member 134, the shielding member 134 may have a supporting end 137. In some embodiments, the mask sheet 100' may be fixed on the mask frame 50. In this case, the mask frame 50 may be further provided with a receiving groove 138 for receiving the supporting end 137 of the shielding member 134. The receiving groove 138 may be, for example, a subsidence groove. The supporting end 137 of the shielding member 134 may be fixed in the receiving groove 138 of the mask frame 50, and it is ensured that the shielding member 134 is tensioned together with the mask sheet 100' so that the shielding member 134 abuts against a surface of the mask sheet 100' facing away from the substrate 20.

Figure 6B:
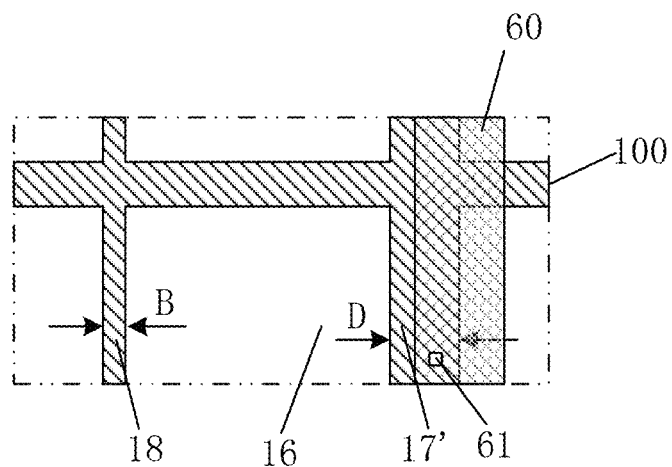
FIG. 6B schematically shows a comparison between a rib of the mask sheet close to a short side of a mask frame and a rib in a normal region.
Figure 9:
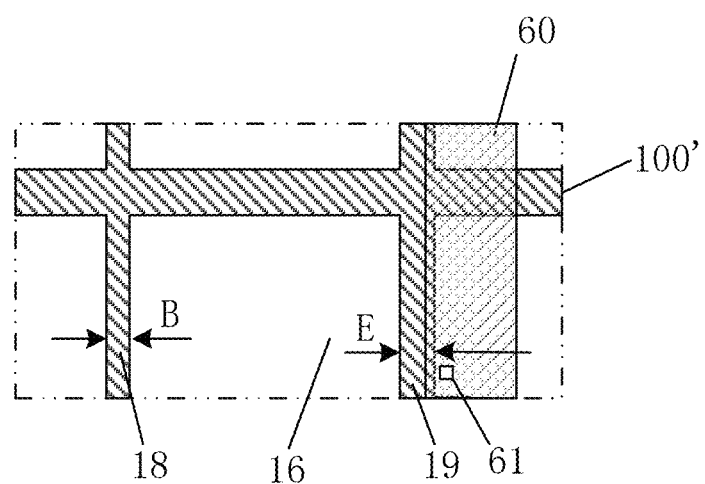
FIG. 9 shows a schematic diagram of a fourth rib of a mask sheet according to some embodiments of the present disclosure.

In addition to the third rib 13, as shown in FIG. 9, the mask sheet 100' may further include a fourth rib 19 located at an edge portion of the mask sheet 100' and arranged parallel to the first rib 11 or the second rib 12. It may be compared with the examples shown in FIG. 6A and FIG. 6B. In the example shown in FIG. 6B, a wide rib 17' is provided in an edge portion of the mask sheet 100 close to the mask frame 50. The wide rib 17' overlaps an alignment mask 60. The wide rib 17' is similar to the wide rib 17 in the example shown in FIG. 6A described above, and may also cause warping of the mask 30 close to the wide rib 17 and a large gap between the mask 30 and the substrate 20 (referring to FIG. 7). As shown in FIG. 6B, the wide rib 17' has a large width and covers a range of an evaporation film thickness test opening 61 provided on the alignment mask 60. Therefore, a portion of the wide rib 17' corresponding to the evaporation film thickness test opening 61 of the alignment mask 60 needs to be opened accordingly. In the embodiment shown in FIG. 9, a width of the fourth rib 19 (as shown by E in FIG. 9) is significantly reduced compared to the width of the wide rib 17' in the example of FIG. 6. For example, the width of the fourth rib 19 may be 1 to 1.2 times the width of the first rib 11 or the second rib 12 parallel to the fourth rib. The fourth rib 19 still remains overlapped with the alignment mask 60. In other words, an orthographic projection of the fourth rib 19 in the direction perpendicular to the mask sheet 100' overlaps an orthographic projection of the alignment mask 60 in the direction perpendicular to the mask sheet 100'. The fourth rib 19 avoids a position of the evaporation film thickness test opening 61, and thus the evaporation film thickness test opening 61 only needs to be provided in the alignment mask 60, and does not need to be provided in the mask sheet 100'.

Figure 11:
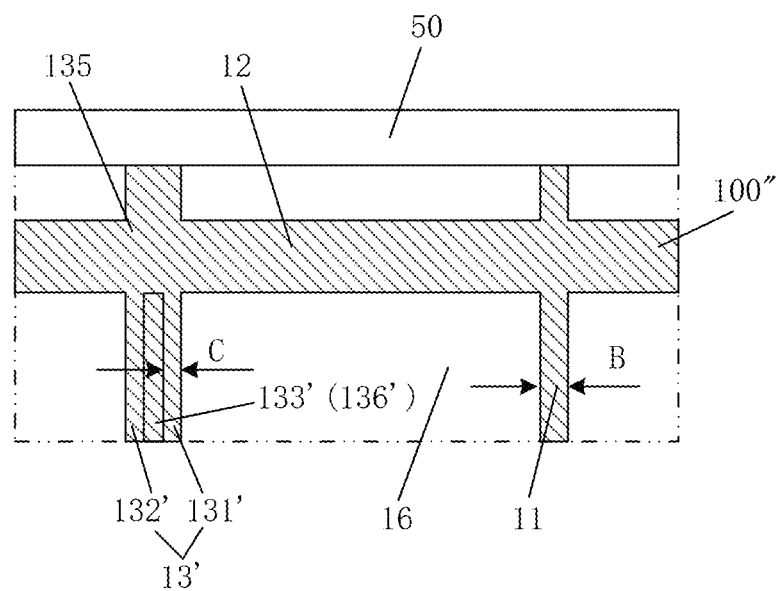
FIG. 11 shows a schematic diagram of a third rib of a mask sheet according to other embodiments of the present disclosure.
Figure 12:
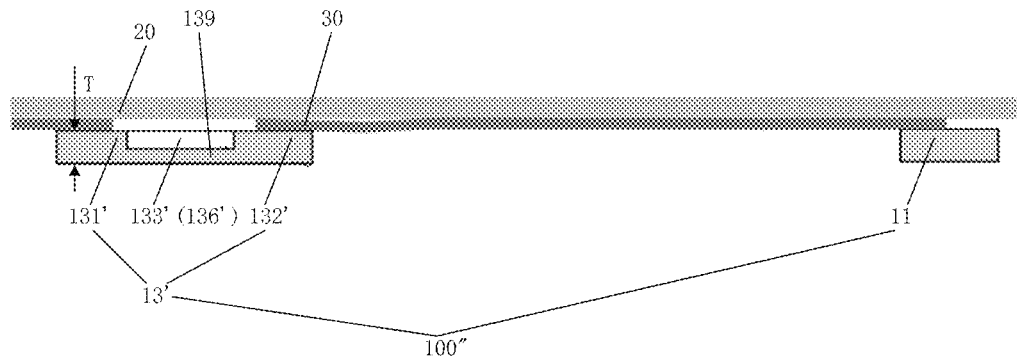
FIG. 12 shows a schematic diagram of the mask sheet shown in FIG. 11 clamping a mask on the substrate.

FIG. 11 and FIG. 12 show a mask sheet 100'' according to other embodiments of the present disclosure. A main difference between the mask sheet 100'' and the embodiments shown in FIG. 8 to FIG. 10 is that a spacer 133' of the third rib 13' is in a form of a blind hole (that is, the spacer 133' includes at least one groove 136') instead of the form of a through hole. As clearly shown in FIG. 12, the spacer 133' does not completely separate a first sub-rib 131' and a second sub-rib 132', and a connecting portion 139 is further provided between the first sub-rib 131' and the second sub-rib 132' to connect the first sub-rib 131' and the second sub-rib 132'. In an evaporation operation, a groove 136' may be, for example, opened toward the substrate 20. By way of example, a depth of the groove 136' may be 0.5 to 0.8 times a total thickness T of the mask sheet 100'' (for example, a thickness of the first sub-rib 131' or the second sub-rib 132'). The groove 136' may be formed, for example, by etching. This design may also reduce a local warping of the mask 30 and the large gap between the mask 30 and the substrate 20 due to the difference in the width of the ribs. In this embodiment, due to an existence of the connecting portion 139, the evaporation material may not pass through the spacer 133' and reach the substrate 20. Therefore, the shielding member 134 is not needed in this solution, and costs may be saved. In some embodiments, the groove 136' may extend along a side 161, adjacent to the third rib 13', of the opening region 16. A length of the groove 136' in the first direction (for example, the x-direction) is less than or equal to a length of the side 161 of the opening region 16 adjacent to the third rib 13'. This is similar to the above-mentioned example in which the spacer includes the through hole 136. Other structures in the mask sheet 100' according to the foregoing embodiments of the present disclosure may be combined with the mask sheet 100'' shown in FIG. 11 and FIG. 12, and the specific details will not be repeated here.

In some embodiments, the width of the third rib 13 may be greater than 6 mm, and the width of the first rib 11 may be greater than 3 mm. The thickness of the mask sheet 100', 100'' may be, for example, 100 micrometers to 200 micrometers. The thickness of the shielding member 134 may be, for example, within a range of 30 μm to 60 μm. In some embodiments, the shielding member 134 may be made of a non-magnetic material, for example, including but not limited to stainless steel, aluminum alloy, and the like. This may prevent the magnetic plate 40 from attracting the shielding member 134 to cause the mask sheet 100', 100'' to be attracted to the substrate 20 quickly and to cause the warping of the mask 30. The mask sheet 100', 100'' and the mask 30 may each include a magnetic material to be attracted by the magnetic plate 40.

In the embodiments of the present disclosure, the first sub-rib 131 and the second sub-rib 132 may extend parallel to the first rib 11 or the second rib 12. This is advantageous for the opening region 16 of the mask sheet 100', 100'' to form a regular shape. In some embodiments, the spacer 133, 133' of the third rib 13, 13' extend parallel to the first sub-rib 131, 131' and the second sub-rib 132, 132'. In some embodiments, the first rib 11 and the second rib 12 may be arranged perpendicular to each other and form an integral body.

Figure 13:
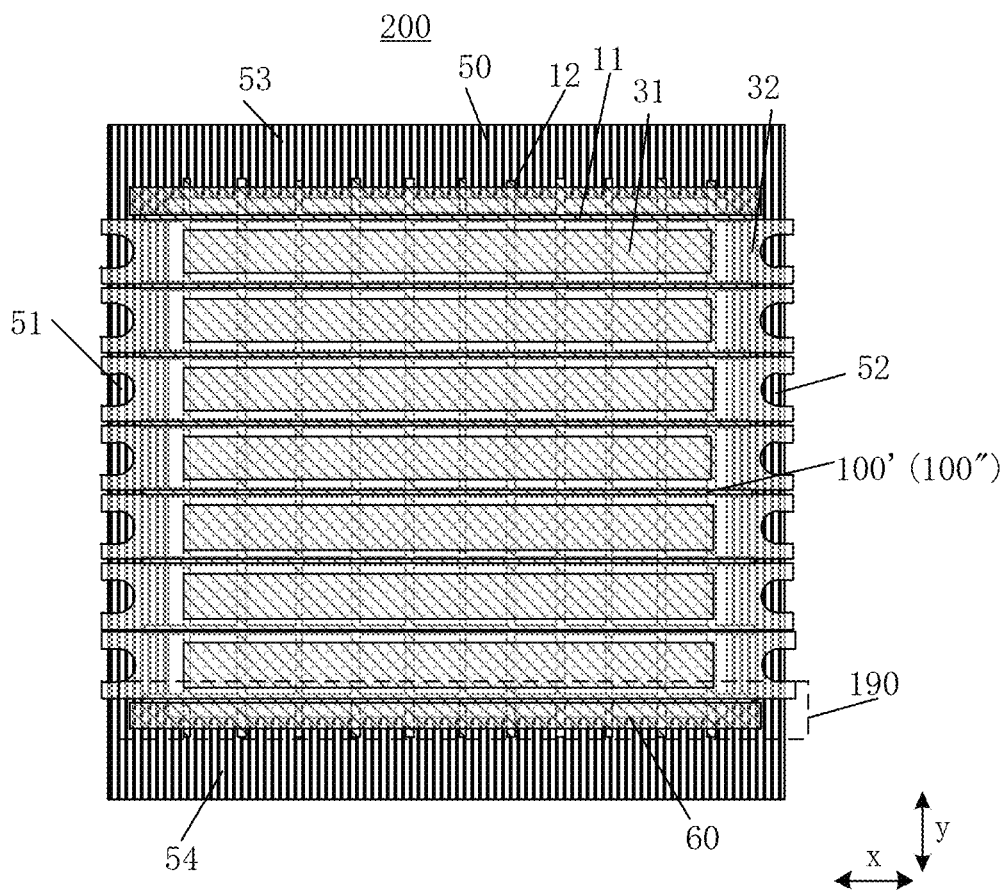
FIG. 13 shows a schematic structural diagram of a mask frame according to some embodiments of the present disclosure.

The embodiments of the present disclosure further provide a mask assembly 200. As shown in FIG. 13, the mask assembly 200 may include: the mask sheet 100', 100'' described in any of the embodiments described above; and at least one mask 30. The at least one mask 30 is arranged on a side of the mask sheet 100', 100'', and is used to cover the plurality of opening regions 16 of the mask sheet 100', 100''. During the evaporation operation, the mask 30 is fixed and held on the surface of the substrate 20 by the mask sheet 100', 100''. It should be noted that, due to a limitation of size and structure, the third rib 13, 13' and the fourth rib 19 are not shown in FIG. 13, and their specific structures may be referred to the embodiments described above. In some embodiments, the mask assembly 200 may further include a mask frame 50 and an alignment mask 60. The mask frame 50 is used to support and fix the mask sheet 100', 100'', and the alignment mask 60 is connected to the mask frame 50.

In the example shown in FIG. 13, the mask assembly 200 includes the mask frame 50 and a plurality of masks 30 fixed on the mask frame 50. Each of the plurality of masks 30 may have a bar shape, and may include a mask pattern region 31 and a fixing region 32. An evaporation pattern for evaporating a film layer such as a light-emitting material may be formed in the mask pattern region 31. The fixing region 32 is located at both ends of the mask 30, and is fixed to the mask frame 50, for example, by welding. The mask sheet 100', 100" is located on a side of the mask 30 facing the mask frame 50. The plurality of masks 30 may be arranged in parallel. The mask frame 50 may have, for example, a rectangular shape. The mask frame 50 may include a first border 51 and a second border 52 opposed to each other, and a third border 53 and a fourth border 54 opposed to each other. The fixing regions 32 at both ends of the mask 30 are respectively fixed to the first border 51 and the second border 52 of the mask frame 50. The alignment mask 60 may also have a long strip shape. In the example of FIG. 13, two alignment masks 60 are provided, which may be arranged parallel to the mask 30, at positions of the mask 30 close to the third border 53 and the fourth border 54, respectively. In some embodiments, orthographic projections of the two alignment masks 60 in the direction perpendicular to the mask sheet 100', 100" overlap orthographic projections of the third border 53 and the fourth border 54 of the mask frame 50 in the direction perpendicular to the mask sheet 100', 100", respectively. The alignment mask 60 is used to perform an alignment operation of the mask 30 in a case of being stretched. The alignment mask 60 may be arranged side by side with the mask 30. For example, in the example shown in FIG. 13, two alignment masks 60 are provided. Before fixing the mask 30 to the mask frame 50, the alignment mask 60 may be tensioned and fixed on the mask frame 50. An alignment mark on the alignment mask 60 may be used as a reference for the alignment of the mask 30 with respect to the mask frame 50 when fixing the mask 30 to the mask frame 50.

In some embodiments, the first rib 11 of the mask sheet 100', 100" may extend in a direction parallel to an extension direction of the mask, and may be used to shield a gap between adjacent masks 30.

In some embodiments, the fourth rib 19 of the mask sheet 100', 100" may be located at an edge portion 190 of the mask sheet 100', 100" and arranged parallel to the first rib 11 or the second rib 12. The fourth rib 19 may at least partially overlap the alignment mask 60.

In some embodiments, the mask assembly may further include a shielding member 134 for shielding the spacer 133 of the mask sheet 100'. The shielding member 134 is located on a side of the third rib 13 away from the mask 30. The orthographic projection of the shielding member 134 on the third rib 13 in the direction perpendicular to the mask sheet 100', 100" covers the spacer 133 of the third rib 13. By way of example, the mask frame 50 may be further provided with the receiving groove 138 for receiving the supporting end 137 of the shielding member 134. The shielding member 134 may be connected to the mask frame 50, for example, by fixing the supporting end 137 to the receiving groove 138 of the mask frame 50.

The embodiments of the present disclosure further provide a mask device. The mask device may include: the mask sheet 100', 100" described in any of the embodiments described above; and at least one mask 30. The at least one mask 30 is arranged on the side of the mask sheet 100', 100" facing the substrate 20, and is used to cover the plurality of opening regions 16 of the mask sheet 100', 100".

In some embodiments, the mask device may further include: a mask frame 50 used to support and fix the mask sheet 100', 100" and the mask 30; and a magnetic plate 40 located on a side of the substrate 20 away from the mask sheet 100', 100". Each of the mask sheet 100', 100" and the mask 30 includes a magnetic material. The magnetic plate 40 is used to attract the mask 30 and the mask sheet 100', 100" toward the substrate 20 through a magnetic force.

In some embodiments, the mask device may further include an alignment mask 60 connected to the mask frame 50 and arranged side by side with the mask 30, so as to provide an alignment reference for the mask 30. The mask sheet 100', 100" may further include a fourth rib 19 located at the edge portion 190 of the mask sheet 100', 100" and arranged parallel to the first rib 11 or the second rib 12. The orthographic projection of the fourth rib 19 in the direction perpendicular to the mask sheet 100', 100" overlaps the orthographic projection of the alignment mask 60 in the direction perpendicular to the mask sheet 100', 100".

In addition, it should be noted that in the mask sheet 100', 100" according to the embodiments of the present disclosure, the opening regions 16 correspond to display panel units, and a pattern may be provided in a portion of the mask 30 falling into each opening region 16 so as to, for example, form film layers of various pixel units. In the example shown in FIG. 14, the opening region 16 has a shape of rectangle, and an extension direction of short sides of the rectangle is the same as an extension direction of the third rib 13. This is only illustrative, and the opening region 16, for example, may also be arranged so that an extension direction of long sides of the rectangle is the same as the extension direction of the third rib 13.

The above descriptions are only preferred embodiments of the present disclosure and explanations of the technical principles applied. Those skilled in the art should understand that the scope of the invention involved in the present disclosure is not limited to the technical solutions formed by the specific combination of the above technical features, and should also cover other technical solutions formed by any combination of the above technical features or their equivalent features without departing from the inventive concept, for example, the technical features formed by mutual replacements of the above-mentioned features and the technical features with similar functions disclosed in the present disclosure (but not limited thereto).

What is claimed is:
1. A mask sheet for evaporation on a substrate, comprising:
 a plurality of first ribs extending in a first direction; and
 a plurality of second ribs extending in a second direction intersecting the first direction, wherein the plurality of first ribs and the plurality of second ribs cross each other to form a plurality of opening regions,
 wherein the mask sheet comprises a first region for an evaporation of a first exposure region of the substrate and a second region for an evaporation of a second exposure region of the substrate,
 wherein a third rib is provided at a boundary of the first region and the second region so as to shield an overlapping exposure region between the first exposure region of the substrate and the second exposure region of the substrate, the third rib comprises a first sub-rib, a second sub-rib, and a spacer for separating the first sub-rib and the second sub-rib, and the third rib has a width greater than a width of the first rib,
 wherein the spacer extends parallel to the first sub-rib and the second sub-rib in the first direction, and
 wherein the spacer comprises at least one through hole or at least one groove extending along a side, of an opening region of a plurality of opening regions in the first direction; wherein said side of the opening region is directly adjacent to the third rib, and a length of the at least one through hole or the at least one groove in the first direction is less than or equal to a length of the side, of the opening region directly adjacent to the third rib.

2. The mask sheet according to claim 1, wherein the boundary of the first region and the second region extends in the first direction, and the first sub-rib and the second sub-rib extend parallel to the first rib.

3. The mask sheet according to claim 1, further comprising:
a shielding member configured to shield the at least one through hole, wherein the shielding member is located on a side of the third rib opposite of the substrate, and an orthographic projection of the shielding member on the third rib in a direction perpendicular to the mask sheet covers the through hole of the third rib.

4. The mask sheet according to claim 1, wherein the shielding member is made of a non-magnetic material.

5. The mask sheet according to claim 1, wherein a depth of the at least one groove is 0.5 to 0.8 times a depth of the first sub-rib.

6. The mask sheet according to claim 1, wherein a width of the first sub-rib is 1 to 1.2 times a width of the first rib parallel to the first sub-rib and the second sub-rib; and/or
a width of the second sub-rib is 1 to 1.2 times the width of the first rib parallel to the first sub-rib and the second sub-rib.

7. The mask sheet according to claim 1, wherein the first rib and the second rib are perpendicular to each other and are integrally formed.

8. The mask sheet according to claim 1, further comprising:
a fourth rib located at an edge portion of the mask sheet and arranged parallel to the first rib or the second rib.

9. The mask sheet according to claim 8, wherein a width of the fourth rib is 1 to 1.2 times a width of the first rib or the second rib parallel to the fourth rib.

10. A mask device, comprising:
the mask sheet according to claim 1; and
at least one mask arranged on a side of the mask sheet facing a substrate, wherein the at least one mask is configured to cover the plurality of opening regions of the mask sheet.

11. The mask device according to claim 10, further comprising:
a mask frame configured to support and fix the mask sheet and the mask; and
a magnetic plate located on a side of the substrate opposite of the mask sheet, wherein the mask sheet and the mask comprise a magnetic material, and the magnetic plate is configured to attract the mask and the mask sheet toward the substrate through a magnetic force.

12. The mask device according to claim 10, further comprising:
an alignment mask connected to the mask frame and arranged side by side with the mask so as to provide an alignment reference for the mask,
wherein the mask sheet further comprises a fourth rib located at an edge portion of the mask sheet and arranged parallel to the first rib or the second rib, and an orthographic projection of the fourth rib in a direction perpendicular to the mask sheet overlaps an orthographic projection of the alignment mask in the direction perpendicular to the mask sheet.

13. The mask sheet according to claim 2, wherein a width of the first sub-rib is 1 to 1.2 times a width of the first rib parallel to the first sub-rib and the second sub-rib; and/or
a width of the second sub-rib is 1 to 1.2 times the width of the first rib parallel to the first sub-rib and the second sub-rib.

14. The mask sheet according to claim 2, wherein the first rib and the second rib are perpendicular to each other and are integrally formed.

15. The mask sheet according to claim 2, further comprising:
a fourth rib located at an edge portion of the mask sheet and arranged parallel to the first rib or the second rib.

16. The mask device according to claim 11, further comprising:
an alignment mask connected to the mask frame and arranged side by side with the mask so as to provide an alignment reference for the mask,
wherein the mask sheet further comprises a fourth rib located at an edge portion of the mask sheet and arranged parallel to the first rib or the second rib, and an orthographic projection of the fourth rib in a direction perpendicular to the mask sheet overlaps an orthographic projection of the alignment mask in the direction perpendicular to the mask sheet.

* * * * *